(12) United States Patent
Mikami et al.

(10) Patent No.: US 9,263,603 B2
(45) Date of Patent: Feb. 16, 2016

(54) SOLAR CELL WITH CONNECTING SHEET, SOLAR CELL MODULE, AND FABRICATION METHOD OF SOLAR CELL WITH CONNECTING SHEET

(71) Applicant: Sharp Kabushiki Kaisha, Osaka-shi, Osaka (JP)

(72) Inventors: Rui Mikami, Osaka (JP); Yoshiya Abiko, Osaka (JP); Kohjiroh Morii, Osaka (JP); Masafumi Satomura, Osaka (JP); Hideo Okada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 14/478,476

(22) Filed: Sep. 5, 2014

(65) Prior Publication Data
US 2014/0377902 A1 Dec. 25, 2014

Related U.S. Application Data

(62) Division of application No. 13/258,825, filed as application No. PCT/JP2010/053777 on Mar. 8, 2010, now abandoned.

(30) Foreign Application Priority Data

Mar. 23, 2009 (JP) .................................. 2009-069880

(51) Int. Cl.
*H01L 31/0224* (2006.01)
*H01L 31/02* (2006.01)
(Continued)

(52) U.S. Cl.
CPC .. *H01L 31/022441* (2013.01); *H01L 31/02008* (2013.01); *H01L 31/042* (2013.01); *H01L 31/048* (2013.01); *H01L 31/0516* (2013.01); *Y02E 10/50* (2013.01)

(58) Field of Classification Search
None
See application file for complete search history.

(56) References Cited

U.S. PATENT DOCUMENTS 5,296,043 A 3/1994 Kawakami et al.
5,942,046 A 8/1999 Kahlfuss et al.
(Continued)

FOREIGN PATENT DOCUMENTS

CN 101373780 2/2009
JP 4-96868 8/1992
(Continued)

OTHER PUBLICATIONS

English-language machine translation of JP 08-298334.
(Continued)

*Primary Examiner* — Seahvosh Nikmanesh
(74) *Attorney, Agent, or Firm* — Nixon & Vanderhye, P.C.

(57) ABSTRACT

A method of fabricating a solar cell with a connecting sheet includes a fixing step of bonding at least a portion of a peripheral region of a back electrode type solar cell (8) to a connecting sheet (10). A method of fabricating a solar cell module includes the step of sealing the solar cell with a connecting sheet obtained by the method on a transparent substrate (17) by a sealing material (18). A solar cell with a connecting sheet has a first adhesive arranged between a back electrode type solar cell (8) and a connecting sheet (10), and a second adhesive arranged at at least a portion of a peripheral region of the back electrode type solar cell (8) to bond a back electrode type solar cell (8) with a connecting sheet (10). A solar cell module has the solar cell with a connecting sheet sealed on a transparent substrate (17) by a sealing material (18).

8 Claims, 5 Drawing Sheets

(51) Int. Cl.
  *H01L 31/042*  (2014.01)
  *H01L 31/048*  (2014.01)
  *H01L 31/05*   (2014.01)

(56) References Cited

U.S. PATENT DOCUMENTS

| | | |
|---|---|---|
| 6,184,056 B1 | 2/2001 | Nakamura et al. |
| 2008/0202576 A1 | 8/2008 | Hieslmair |
| 2008/0202577 A1 | 8/2008 | Hieslmair |
| 2009/0032087 A1 | 2/2009 | Kalejs |
| 2009/0050190 A1 | 2/2009 | Nishida et al. |
| 2010/0263718 A1 | 10/2010 | Abiko |
| 2011/0014725 A1 | 1/2011 | Abiko et al. |
| 2011/0155203 A1 | 6/2011 | Funakoshi |
| 2012/0012180 A1* | 1/2012 | Abiko .................. H01L 31/048 136/256 |

FOREIGN PATENT DOCUMENTS

| | | |
|---|---|---|
| JP | 5-299686 | 11/1993 |
| JP | 6-244444 | 9/1994 |
| JP | 8-298334 | 11/1996 |
| JP | 2532104 | 1/1997 |
| JP | 11-330517 | 11/1999 |
| JP | 11-330526 | 11/1999 |
| JP | 2001-036118 | 2/2001 |
| JP | 2002-198384 | 7/2002 |
| JP | 2002-319691 | 10/2002 |
| JP | 2003-128881 | 5/2003 |
| JP | 2004-221406 | 8/2004 |
| JP | 2005-310830 | 11/2005 |
| JP | 2005-340362 | 12/2005 |
| WO | 2009/019940 | 2/2009 |
| WO | 2009/060753 | 5/2009 |
| WO | 2009/096114 | 8/2009 |

OTHER PUBLICATIONS

English-language machine translation of JP 2005-340362.
International Search Report mailed Jun. 8, 2010 for PCT/JP2010/053777.
Office Action mailed Sep. 27, 2013 in counterpart Korean Patent Application No. 10-2011-7024973 and English-language translation thereof.

* cited by examiner

FIG.7
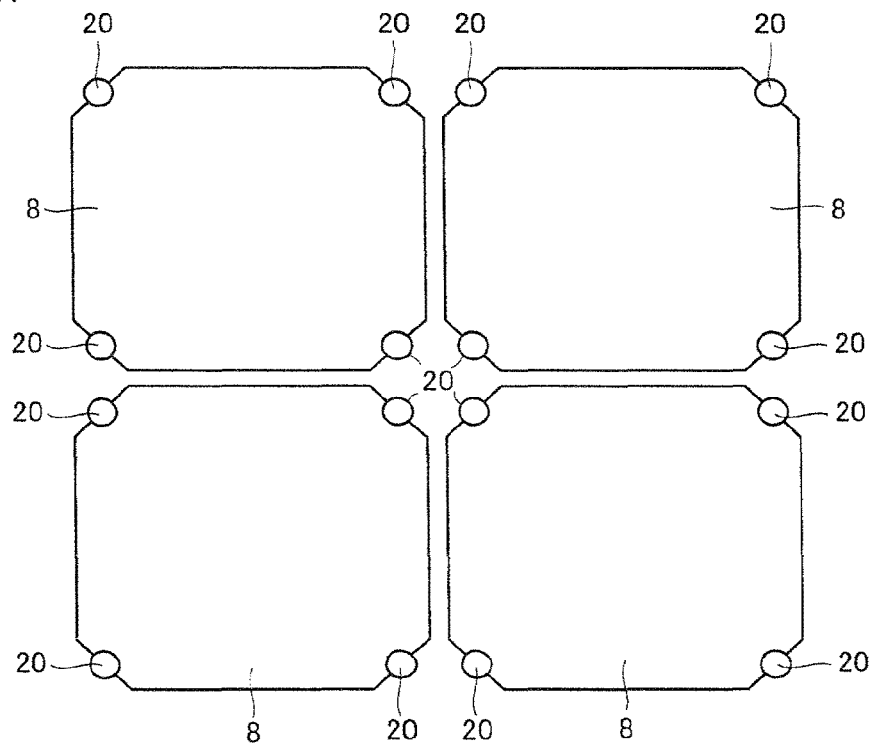
FIG.8
(a)
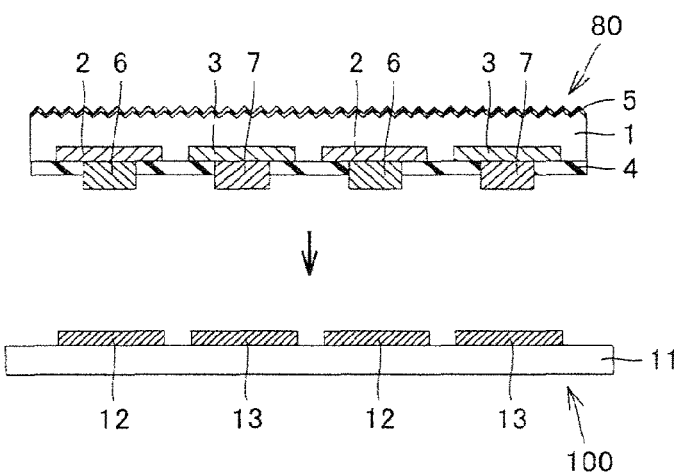
(b)
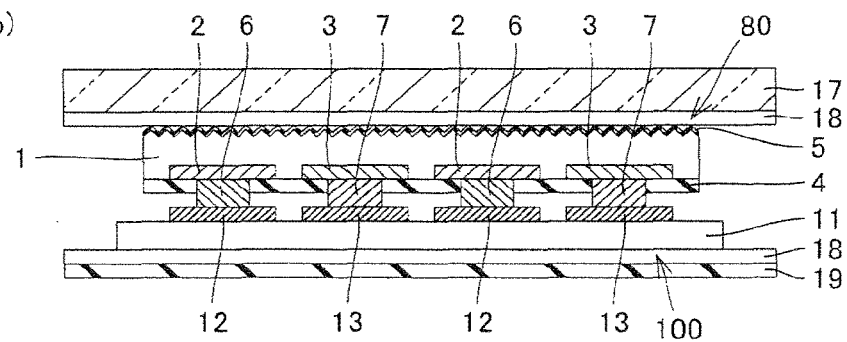

SOLAR CELL WITH CONNECTING SHEET, SOLAR CELL MODULE, AND FABRICATION METHOD OF SOLAR CELL WITH CONNECTING SHEET

RELATED APPLICATIONS

The instant application is a divisional application of co-pending U.S. patent application Ser. No. 13/258,825, which is the U.S. national phase of International Application No. PCT/JP2010/053777, filed Mar. 8, 2010, which designated the U.S. and claims priority to JP Application No. 2009-069880, filed Mar. 23, 2009, the entire contents of each of which are incorporated herein by reference.

TECHNICAL FIELD

The present invention relates to a solar cell with a connecting sheet, a solar cell module, and a method of fabricating a solar cell with a connecting sheet.

BACKGROUND ART

In recent years, the expectation for solar cells that convert solar energy into electric energy as the energy source for the next generation has increased significantly from the standpoint of protecting global environment. Among the various types of solar cells employing compound semiconductor and/or organic material, solar cells employing silicon crystal have become the main stream.

Solar cells that are now most fabricated in quantity and available on the market are the double-sided electrode type solar cells based on a configuration in which an n electrode is formed at the surface corresponding to the sunlight incident side (light receiving face), and a p electrode is formed at the surface opposite to the light receiving face side (back surface).

In addition, Japanese Patent Laying-Open No. 2005-310830 (Patent Literature 1), for example, discloses a back electrode type solar cell absent of an electrode at the light receiving face of the solar cell, and having the n electrode and p electrode formed only at the back surface of the solar cell.

The electric energy that can be utilized by a single back electrode type solar cell of the configuration disclosed in Patent Literature 1 is limited. Therefore, an approach to electrically connect a plurality of back electrode type solar cells of the aforementioned configuration to obtain a solar cell module is now under study.

CITATION LIST

Patent Literature

PTL 1: Japanese Patent Laying-Open No. 2005-310830
PTL 2: Japanese Patent Laying-Open No. 2001-036118

SUMMARY OF INVENTION

Technical Problem

As a method of obtaining a solar cell module by electrically connecting a plurality of back electrode type solar cells, there is known the method of obtaining a solar cell module by sealing a solar cell with a connecting sheet that is a back electrode type solar cell placed on a connecting sheet, by means of a sealing material.

An example of a method of producing a solar cell module by sealing the aforementioned solar cell with a connecting sheet by a sealing material will be described hereinafter with reference to the schematic sectional views of FIG. 8(a) and (b).

Referring to FIG. 8(a), a solar cell with a connecting sheet is produced by placing a back electrode type solar cell 80 on a connecting sheet 100.

In this solar cell with a connecting sheet, an electrode 6 for first conductivity type in contact with an impurity diffusion region 2 for first conductivity type at the back surface of a semiconductor substrate 1 of back electrode type solar cell 80 is placed on a wire 12 for first conductivity type formed on an insulative base material 11 of connecting sheet 100, and an electrode 7 for second conductivity type in contact with an impurity diffusion region 3 for second conductivity type at the back surface of semiconductor substrate 1 of back electrode type solar cell 80 is placed on a wire 13 for second conductivity type formed on insulative base material 11 of connecting sheet 100.

A texture structure is formed at the light receiving face of semiconductor substrate 1 in back electrode type solar cell 80. An antireflection film 5 is formed on the texture structure. Furthermore, a passivation film 4 is formed at the back surface of semiconductor substrate 1 of back electrode type solar cell 80.

Referring to FIG. 8(b), by placing and heating the solar cell with a connecting sheet produced as set forth above between a transparent substrate 17 such as a glass substrate including a sealing material 18 such as ethylene vinyl acetate and a back film 19 such as a polyester film including sealing material 18, there is produced a solar cell module having back electrode type solar cell 80 constituting a solar cell with a connecting sheet sealed in sealing material 18.

The aforementioned method is advantageous in that a solar cell module can be fabricated effectively since a plurality of back electrode type solar cells 80 can be connected electrically by just placing each back electrode type solar cell 80 on connecting sheet 100.

However, in the case where the solar cell with a connecting sheet is heated in the sealing step without physical fixing between back electrode type solar cell 80 and connecting sheet 100 according to the above-described method, position deviation in back electrode type solar cell 80 relative to connecting sheet 100 may occur due to thermal expansion of semiconductor substrate 1 in back electrode type solar cell 80, flowability of sealing material 18, and the like.

Japanese Patent Laying-Open No. 2001-036118 (Patent Literature 2) discloses a method of preventing position deviation in a double-sided electrode type solar cell by curing a portion of the sealing material in advance for fixation.

Specifically, the method disclosed in Patent Literature 2 includes the steps of applying in advance an ultraviolet curable resin to the light receiving face side of a double-sided electrode type solar cell, installing the double-sided electrode type solar cell, applying a thermosetting liquid resin to the back surface side of the double-sided electrode type solar cell, irradiating the ultraviolet curable resin with ultraviolet ray such that it cures to fix the position of the double-sided electrode type solar cell, and then heating the thermosetting liquid resin such that it cures to seal the double-sided electrode type solar cell.

The method of Patent Literature 2 requires raising the cross-linking rate of the ultraviolet curable resin used for fixing the double-sided electrode type solar cell from the standpoint of preventing position deviation in the double-sided electrode type cell. However, the adherence with the thermosetting liquid resin will be degraded if the cross-linking rate of the ultraviolet curable resin is raised, leading to the problem of degradation in the sealing property of the double-sided electrode type cell.

Moreover, the pitch between electrodes of back electrode type solar cell 80 in the aforementioned solar cell with a connecting sheet was extremely small, requiring considerably high position accuracy of back electrode type solar cell 80 relative to connecting sheet 100. Therefore, there is a need for a configuration of a solar cell with a connecting sheet and a solar cell module, as well as a method of fabricating a solar cell with a connecting sheet, corresponding to such problems.

In view of the foregoing, an object of the present invention is to provide a solar cell with a connecting sheet, a solar cell module, and a method of fabricating a solar cell with a connecting sheet, allowing effective suppression of position deviation in a back electrode type solar cell relative to a connecting sheet.

Solution to Problem

The present invention is directed to a method of fabricating a solar cell with a connecting sheet including a back electrode type solar cell and a connecting sheet. The back electrode type solar cell includes a semiconductor substrate where an impurity diffusion region for first conductivity type and an impurity diffusion region for second conductivity type are formed, an electrode for first conductivity type formed at one face side of the semiconductor substrate corresponding to the impurity diffusion region for first conductivity type, and an electrode for second conductivity type formed at the one face side of the semiconductor substrate corresponding to the impurity diffusion region for second conductivity type. The connecting sheet includes an insulative base material, a wire for first conductivity type arranged at the insulative base material, and a wire for second conductivity type arranged at the insulative base material. The method of fabricating a solar cell with a connecting sheet includes the step of arranging the back electrode type solar cell on the connecting sheet such that the electrode for first conductivity type of the back electrode type solar cell is arranged on the wire for first conductivity type of the connecting sheet and the electrode for second conductivity type of the back electrode type solar cell is arranged on the wire for second conductivity type of the connecting sheet, and temporary fixing at least a portion of a peripheral region of the back electrode type solar cell to the connecting sheet.

The method of fabricating a solar cell with a connecting sheet of the present invention preferably includes the step of applying a first adhesive in advance to the back electrode type solar cell and/or connecting sheet prior to the arranging step. The temporary fixing step preferably includes the step of curing the first adhesive located at at least a portion of the peripheral region of the back electrode type solar cell.

In the method of fabricating a solar cell with a connecting sheet of the present invention, the temporary fixing step preferably includes the step of curing a second adhesive including ultraviolet curable resin arranged between at least a portion of the peripheral region of the back electrode type solar cell and the connecting sheet.

In the method of fabricating a solar cell with a connecting sheet of the present invention, the temporary fixing step preferably includes the step of attaching an adhesive tape between at least a portion of a peripheral region of the back electrode type solar cell and the connecting sheet.

In the method of fabricating a solar cell with a connecting sheet of the present invention, the back electrode type solar cell takes substantially an octagon shape having 4 corners corresponding to short sides or arcs. The peripheral region of the back electrode type solar cell preferably includes 4 corners.

Furthermore, the present invention is directed to a method of fabricating a solar cell module including the step of sealing a solar cell with a connecting sheet, produced by the method of fabricating a solar cell with a connecting sheet set forth above, on a transparent substrate by a sealing material.

Moreover, the present invention is directed to a solar cell with a connecting sheet including a back electrode type solar cell and a connecting sheet. The back electrode type solar cell includes a semiconductor substrate where an impurity diffusion region for first conductivity type and an impurity diffusion region for second conductivity type are formed, an electrode for first conductivity type formed at one face side of the semiconductor substrate corresponding to the impurity diffusion region for first conductivity type, and an electrode for second conductivity type formed at the one face side of the semiconductor substrate corresponding to the impurity diffusion region for second conductivity type. The connecting sheet includes an insulative base material, a wire for first conductivity type arranged at the insulative base material, and a wire for second conductivity type arranged at the insulative base material. The back electrode type solar cell is arranged on the connecting sheet such that the electrode for first conductivity type of the back electrode type solar cell is electrically connected to the wire for first conductivity type of the connecting sheet, and the electrode for second conductivity type of the back electrode type solar cell is electrically connected to the wire for second conductivity type of the connecting sheet. A first adhesive material is arranged between the back electrode type solar cell and the connecting sheet. In addition, a second adhesive material for bonding the back electrode type solar cell to the connecting sheet is arranged at at least a portion of a peripheral region of the back electrode type solar cell.

In addition, the present invention is directed to a solar cell module having the above-described solar cell with a connecting sheet set forth above sealed on a transparent substrate by a sealing material.

Advantageous Effects of Invention

According to the present invention, there can be provided a solar cell with a connecting sheet, a solar cell module, and a method of fabricating a solar cell with a connecting sheet, allowing effective suppression of position deviation in a back electrode type solar cell relative to a connecting sheet.

BRIEF DESCRIPTION OF DRAWINGS

FIG. 7 is a schematic plan view illustrating an example of an applied site of ultraviolet curable resin in the present invention.

FIGS. 8(a) and (b) are schematic sectional views illustrating an example of a method of producing a solar cell module by sealing a solar cell with a connecting sheet by a sealing material.

DESCRIPTION OF EMBODIMENTS

Figure 1:
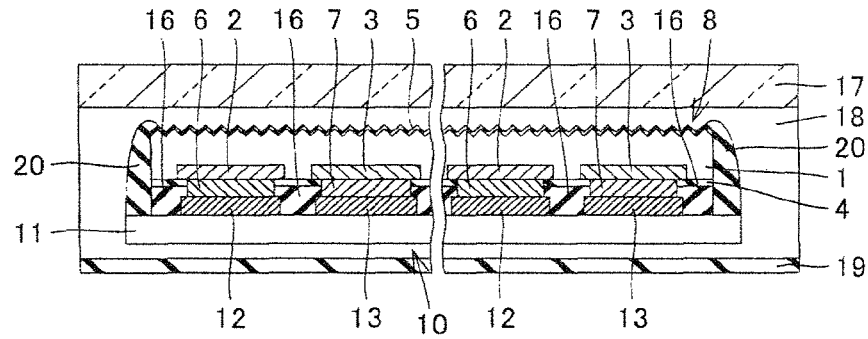
FIG. 1 is a schematic sectional view of an example of a solar cell module of the present invention.

Embodiments of the present invention will be described hereinafter. In the drawings of the present invention, the same reference characters represent the same or corresponding elements.

FIG. 1 is a schematic sectional view of an example of a solar cell module of the present invention. The solar cell module based on the configuration of FIG. 1 includes a solar cell with a connecting sheet, configured so as to have a back electrode type solar cell 8 arranged on a connecting sheet 10. The solar cell with a connecting sheet is sealed in a sealing material 18 such as of ethylene vinyl acetate located at the region between a transparent substrate 17 such as a glass substrate and a back film 19 such as a polyester film.

Back electrode type solar cell 8 includes a semiconductor substrate 1, an impurity diffusion region 2 for first conductivity type and an impurity diffusion region 3 for second conductivity type formed at the back surface of semiconductor substrate 1, an electrode 6 for first conductivity type formed in contact with impurity diffusion region 2 for first conductivity type, and an electrode 7 for second conductivity type formed in contact with impurity diffusion region 3 for second conductivity type.

The light receiving face of semiconductor substrate 1 in back electrode type solar cell 8 is formed with a concavo-convex structure such as a texture structure. An antireflection film 5 is formed to cover the concavo-convex structure. Furthermore, a passivation film 4 is formed at the back surface of semiconductor substrate 1 in back electrode type solar cell 8.

In the present example, impurity diffusion region 2 for first conductivity type and impurity diffusion region 3 for second conductivity type are formed in strips, each extending towards the surface side and/or back side of the paper sheet of FIG. 1. Impurity diffusion region 2 for first conductivity type and impurity diffusion region 3 for second conductivity type are arranged alternately with a predetermined distance therebetween at the back surface of semiconductor substrate 1.

Also in the present example, electrode 6 for first conductivity type and electrode 7 for second conductivity type are formed in strips, each extending towards the surface side and/or back side of the paper sheet of FIG. 1. Electrode 6 for first conductivity type and electrode 7 for second conductivity type are formed along and in contact with impurity diffusion region 2 for first conductivity type and impurity diffusion region 3 for second conductivity type, respectively, at the back surface of semiconductor substrate 1, via an opening provided in passivation film 4.

Connecting sheet 10 includes an insulative base material 11, a wire 12 for first conductivity type and wire 13 for second conductivity type, formed in a predetermined shape on the surface of insulative base material 11.

Each wire 12 for first conductivity type on insulative base material 11 of connecting sheet 10 is formed facing a corresponding one electrode 6 for first conductivity type at the back surface of back electrode type solar cell 8.

Each wire 13 for second conductivity type on insulative base material 11 of connecting sheet 10 is formed facing a corresponding one electrode 7 for second conductivity type at the back surface of back electrode type solar cell 8.

In the present example, wire 12 for first conductivity type and wire 13 for second conductivity type are formed in strips, each extending towards the surface side and/or back side of the paper sheet of FIG. 1.

The above-described back electrode type solar cell 8 and connecting sheet 10 are bonded by ultraviolet curable resin 20 arranged at at least a portion of the peripheral region of back electrode type solar cell 8, and also bonded by a connecting material 16 arranged at the region between back electrode type solar cell 8 located at the inner side of the peripheral region of back electrode type solar cell 8 having ultraviolet curable resin 20 arranged and connecting sheet 10.

An example of a method of fabricating a solar cell module based on the configuration shown in FIG. 1 will be described hereinafter. First, a method of forming a back electrode type solar cell 8 will be described, followed by a method of forming a connecting sheet 10, and then a method of forming a solar cell with a connecting sheet by bonding back electrode type solar cell 8 and connecting sheet 10. However, the sequence of forming back electrode type solar cell 8 and connecting sheet 10 is not particularly limited in the present invention.

Figure 2:
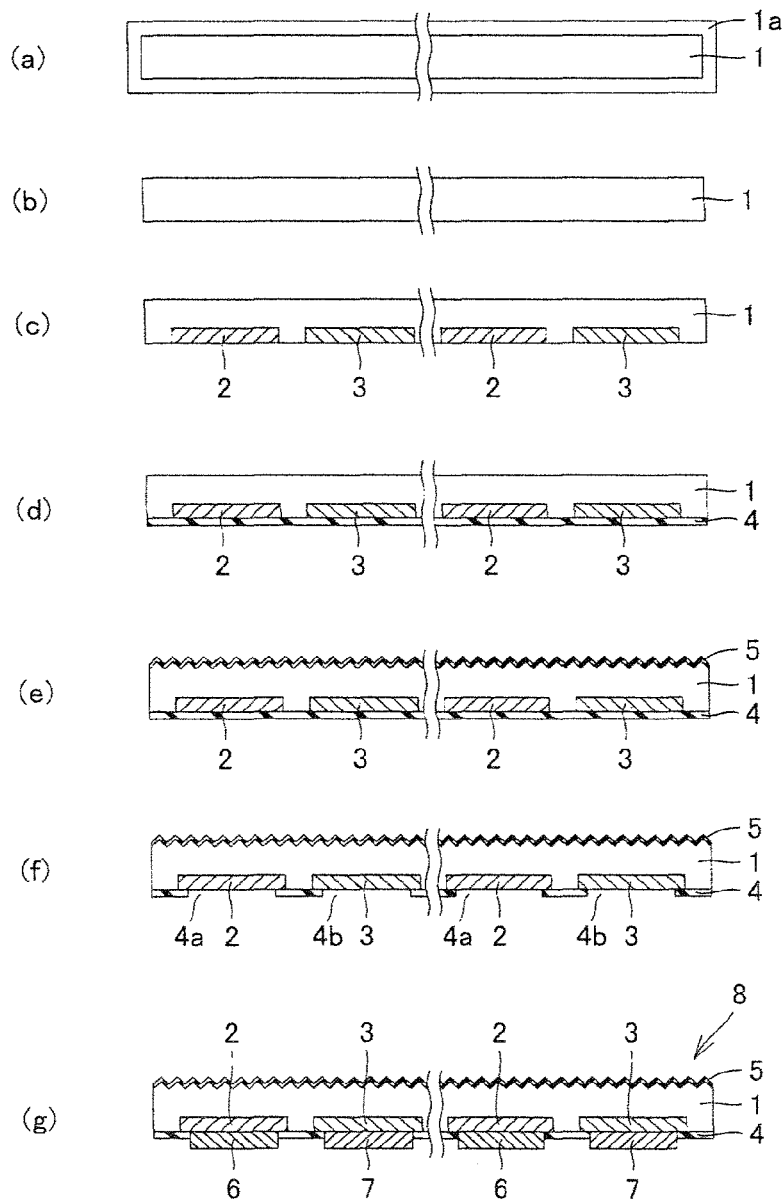
FIGS. 2(*a*)-(*g*) are schematic sectional views illustrating an example of a method of fabricating a back electrode type solar cell employed in the solar cell module of the present invention.

Referring to the schematic sectional view of FIG. 2(a), an ingot is sliced, for example, to prepare a semiconductor substrate 1 with a slice damage 1a at the surface. For semiconductor substrate 1, a silicon substrate such as of polycrystalline silicon or single crystal silicon having the conductivity type of n type or p type can be used, for example.

Referring to the schematic sectional view of FIG. 2(b), slice damage 1a is removed from the surface of semiconductor substrate 1. This removal of slice damage 1a can be performed, when semiconductor substrate 1 is formed of the aforementioned silicon substrate, by etching the surface of the silicon substrate after slicing with a mixed acid of hydrogen fluoride aqueous solution and nitric acid, or an alkali aqueous solution such as of sodium hydroxide.

Although the size and shape of semiconductor substrate 1 after removal of slice damage 1a is not particularly limited, the thickness of semiconductor substrate 1 can be set to be greater than or equal to 50 μm and less than or equal to 400 μm, particularly preferably to be approximately 160 μm.

Referring to the schematic sectional view of FIG. 2(c), impurity diffusion region 2 for first conductivity type and impurity diffusion region 3 for second conductivity type are formed at the back surface of semiconductor substrate 1. Impurity diffusion region 2 for first conductivity type can be formed by, for example, vapor phase diffusion using gas including first conductivity type impurities. Impurity diffusion region 3 for second conductivity type can be formed by, for example, vapor phase diffusion using gas including second conductivity type impurities.

Impurity diffusion region 2 for first conductivity type is not particularly limited as long as the region includes first conductivity type impurities, and indicates n type or p type conductivity. For first conductivity type impurities, n type impurities such as phosphorus can be employed when the first conductivity type corresponds to the n type. When the first conductivity type corresponds to the p type, p type impurities such as boron, aluminium or the like can be used.

Impurity diffusion region 3 for second conductivity type is not particularly limited as long as the region includes second conductivity type impurities, and indicates a conductivity type opposite to that of impurity diffusion region 2 for first conductivity type. For second conductivity type impurities, n type impurities such as phosphorus, for example, can be employed when the second conductivity type corresponds to the n type. When the second conductivity type corresponds to the p type, p type impurities such as boron, aluminium, or the like can be used.

The first conductivity type may be either the n type or p type, and the second conductivity type is opposite to the first conductivity type. Specifically, when the first conductivity type corresponds to the n type, the second conductivity type corresponds to the p type. When the first conductivity type corresponds to the p type, the second conductivity type corresponds to the n type.

For gas including first conductivity type impurities, gas including n type impurities such as phosphorus, $POCl_3$, for example, can be used. When the first conductivity type corresponds to the p type, gas including p type impurities such as boron, $BBr_3$, for example, can be used.

For gas including second conductivity type impurities, gas including n type impurities such as phosphorus, $POCl_3$, for example, can be used. When the second conductivity type corresponds to the p type, gas including p type impurities such as boron, $BBr_3$, for example, can be used.

Referring to the schematic sectional view of FIG. 2(d), passivation film 4 is formed at the back surface of semiconductor substrate 1. Passivation film 4 can be formed by thermal oxidation, plasma CVD (Chemical Vapor Deposition), and the like.

Passivation film 4 may include, but not limited to, a silicon oxide film, a silicon nitride film, a stacked layer of a silicon oxide film and silicon nitride film, or the like.

The thickness of passivation film 4 can be set greater than or equal to 0.05 μm and less than or equal to 1 μm, for example, particularly preferably set to be approximately 0.2 μm.

Referring to the schematic sectional view of FIG. 2(e), following the formation of a concavo-convex structure such as a texture structure all over the light receiving face of semiconductor substrate 1, antireflection film 5 is formed on the concavo-convex structure.

The texture structure can be formed by, for example, etching the light receiving face of semiconductor substrate 1. For example, when semiconductor substrate 1 is a silicon substrate, the light receiving face of semiconductor substrate 1 can be etched using an etchant obtained by adding isopropyl alcohol to an alkali aqueous solution such as sodium hydroxide or potassium hydroxide, and heating the liquid greater than or equal to 70° C. and less than or equal to 80° C.

Antireflection film 5 can be formed by plasma CVD, or the like. Antireflection film 5 may include, but not limited to, a silicon nitride film.

Referring to the schematic sectional view of FIG. 2(f), a contact hole 4a and a contact hole 4b are formed by removing some of passivation film 4 at the back surface of semiconductor substrate 1. Contact hole 4a is formed such that at least a portion of the surface of impurity diffusion region 2 for first conductivity type is exposed. Contact hole 4b is formed such that at least a portion of the surface of impurity diffusion region 3 for second conductivity type is exposed.

Each of contact hole 4a and contact hole 4b may be formed by various methods such as forming a resist pattern having an opening at the region corresponding to the formation sites of contact holes 4a and 4b on passivation film 4 by photolithography, and then etching away passivation film 4 through the opening of the resist pattern, or such as applying etching paste to the region of passivation film 4 corresponding to the formation sites of contact holes 4a and 4b, followed by heating to remove passivation film 4 by etching.

Referring to the schematic sectional view of FIG. 2(g), electrode 6 for first conductivity type in contact with impurity diffusion region 2 for first conductivity type through contact hole 4a and electrode 7 for second conductivity type in contact with impurity diffusion region 3 for second conductivity type through contact hole 4b are formed to produce back electrode type solar cell 8.

Here, an electrode formed of metal such as silver can be employed for electrode 6 for first conductivity type and electrode 7 for second conductivity type.

Figure 3:
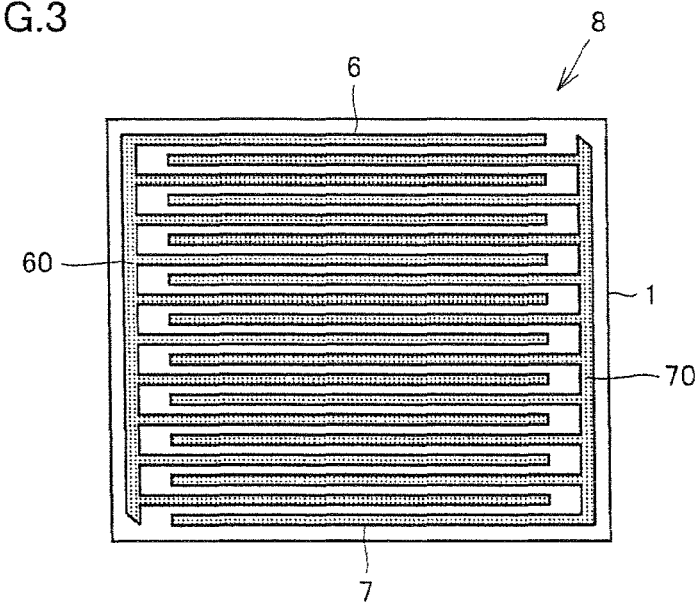
FIG. 3 is a schematic plan view of an example of a back surface of a back electrode type solar cell employed in the solar cell module of the present invention.

FIG. 3 is a schematic plan view of an example of a back surface of back electrode type solar cell 8 produced as set forth above. At the back surface of back electrode type solar cell 8, each of electrode 6 for first conductivity type and electrode 7 for second conductivity type is formed in strips. The plurality of strip-like electrodes 6 for first conductivity type are all connected to one strip-like collector electrode 60 for first conductivity type. The plurality of strip-like electrodes 7 for second conductivity type are all connected to one strip-like collector electrode 70 for second conductivity type. In the present example, collector electrode 60 for first conductivity type is formed to extend in a direction perpendicular to the longitudinal direction of strip-like electrode 6 for first conductivity type. Collector electrode 70 for second conductivity type is formed to extend in a direction perpendicular to the longitudinal direction of strip-like electrode 7 for second conductivity type.

At the back surface of back electrode type solar cell 8 shown in FIG. 3, one collector electrode 60 for first conductivity type and a plurality of electrodes 6 for first conductivity type constitute one comb-shaped electrode. One collector electrode 70 for second conductivity type and a plurality of electrodes 7 for second conductivity type constitute one comb-shaped electrode. An electrode 6 for first conductivity type and an electrode 7 for second conductivity type corresponding to the comb teeth of the comb-shaped electrode are arranged facing each other such that each one is interdigitated with another. One strip-like impurity diffusion region 2 for first conductivity type is arranged at the back surface portion of semiconductor substrate 1 where strip-like electrode 6 for first conductivity type is in contact. One strip-like impurity diffusion region 3 for second conductivity type is arranged at the back surface portion of semiconductor substrate 1 where strip-like electrode 7 for second conductivity type is in contact.

Connecting sheet 10 can be produced as set forth below, for example. Referring to the schematic sectional view of FIG. 4(a), a conductor layer 41 is formed on the surface of insulative base material 11. For insulative base material 11, a substrate formed of, but not limited to, resin such as polyester, polyethylene naphthalate, polymide, or the like, for example, can be used.

The thickness of insulative base material 11 can be set greater than or equal to 10 μm and less than or equal to 200 μm, for example. Particularly, the thickness thereof is preferably approximately 25 μm.

Conductor layer 41 is formed of, but not limited to, metal such as copper, for example.

Figure 4:
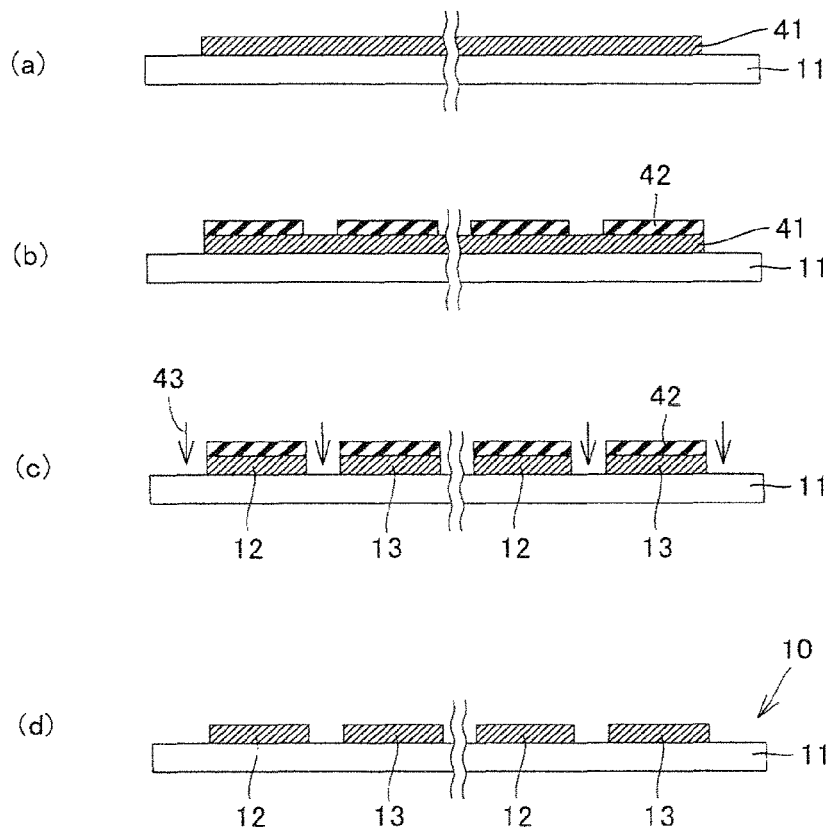
FIGS. 4(*a*)-(*d*) are schematic sectional views illustrating an example of a method of fabricating a connecting sheet employed in the solar cell module of the present invention.

Referring to the schematic sectional view of FIG. 4(b), a resist pattern 42 is formed on conductor layer 41 at the surface of insulative base material 11. At this stage, resist pattern 42 is configured to have an opening at a site other than the formation site of wire 12 for first conductivity type and wire 13 for second conductivity type. The resist constituting resist pattern 42 can be formed using the conventionally well known type. An application method such as by screen printing, dispenser application, ink jet application, or the like may be employed.

Referring to the schematic sectional view of FIG. 4(c), conductor layer 41 is subjected to patterning by removing the portion of conductor layer 41 exposed at resist pattern 42 in the direction of arrow 43 to form wire 12 for first conductivity type and wire 13 for second conductivity type from the remainder of conductor layer 41.

Conductor layer 41 can be removed by wet etching or the like employing the solution of acid or alkaline.

Referring to the schematic sectional view of FIG. 4(d), resist pattern 42 is completely removed from the surface of wire 12 for first conductivity type and wire 13 for second conductivity type to produce connecting sheet 10.

Figure 5:
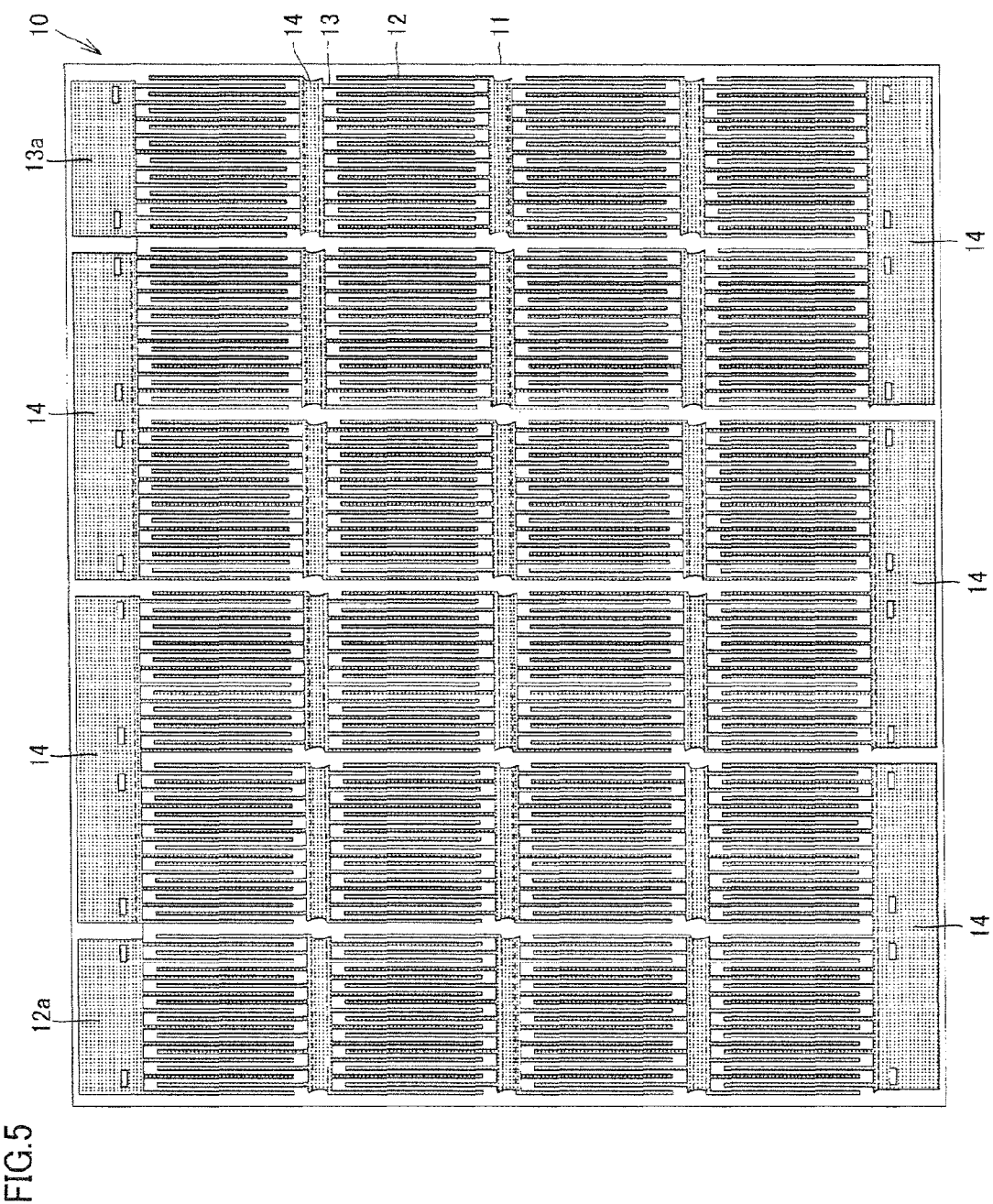
FIG. 5 is a schematic plan view of an example of a connecting sheet employed in the solar cell module of the present invention.

FIG. 5 is a schematic plan view of an example of a surface of connecting sheet 10 produced as set forth above. On the surface of insulative base material 11 of connecting sheet 10, wire 12 for first conductivity type and wire 13 for second conductivity type are formed in strips. On the surface of insulative base material 11 of connecting sheet 10, strip-like connecting wire 14 is formed. Wire 12 for first conductivity type and wire 13 for second conductivity type are electrically connected by connecting wire 14. Connecting wire 14 can be formed from the remainder of conductor layer 41, likewise with wire 12 for first conductivity type and wire 13 for second conductivity type.

By the configuration set forth above, all wires 12 for first conductivity type and wires 13 for second conductivity type constituting the comb shape, adjacent to each other, are electrically connected through connecting wire 14, except for a wire 12 for first conductivity type and a wire 13 for second conductivity type located at respective ends of connecting sheet 10. Accordingly, back electrode type solar cells arranged adjacent to each other on connecting sheet 10 will be electrically connected with each other. Thus, all the back electrode type solar cells arranged on connecting sheet 10 will be electrically connected in series.

A solar cell with a connecting sheet can be produced as set forth below, for example.

Figure 6:
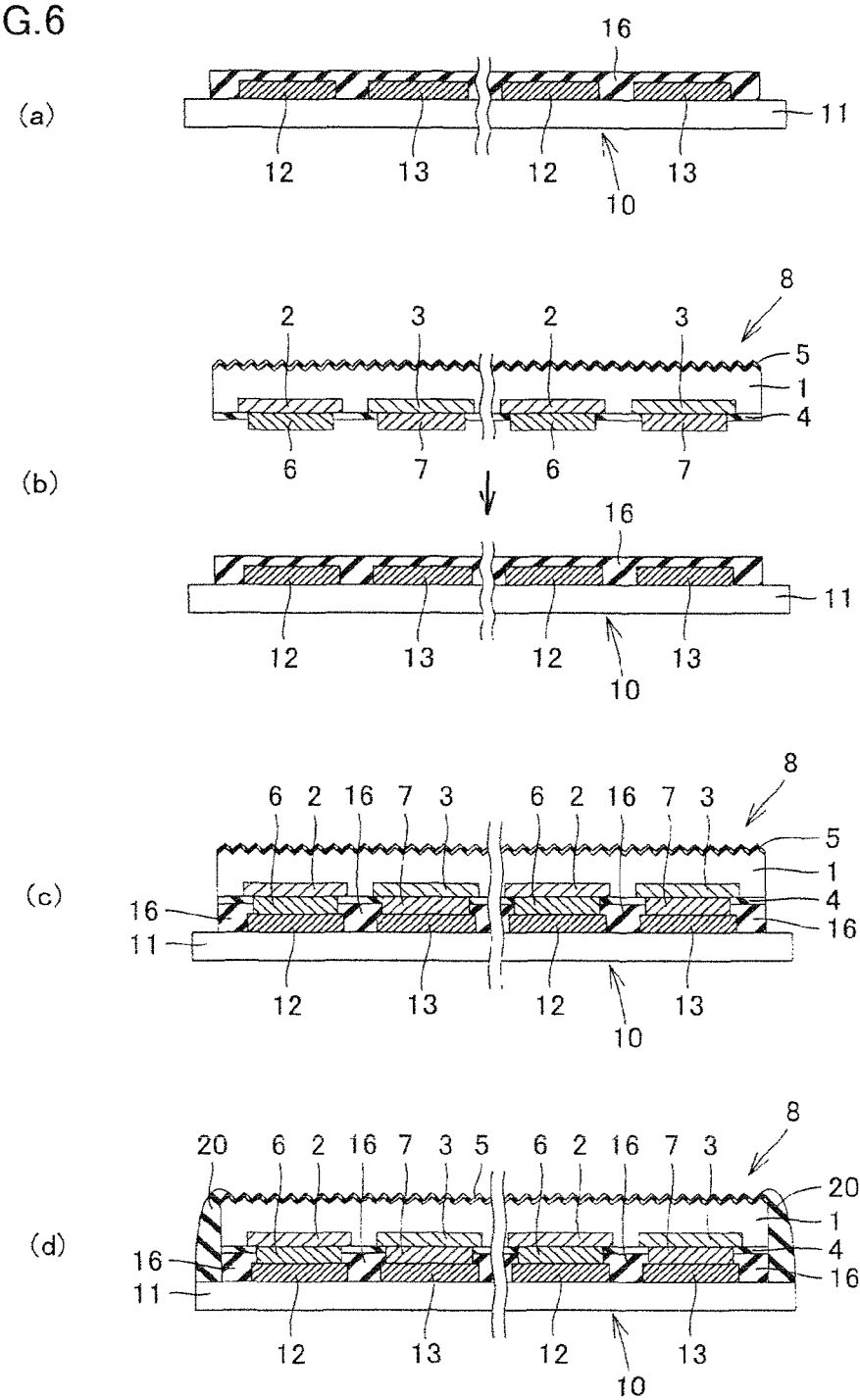
FIGS. 6(a)-(d) are schematic sectional views illustrating an example of a method of fabricating a solar cell with a connecting sheet of the present invention.

Referring to the schematic sectional view of FIG. 6(a), a connecting material 16 is applied on the surface of connecting sheet 10 produced as set forth above. Connecting material 16 can be applied by a method such as by screen printing, dispenser application, ink jet application, or the like. For connecting material 16, thermosetting resin or the like, for example, may be employed. For thermosetting resin, resin having electrical insulation, and cured by heating can be employed without particular limitation. For example, the conventional well-known thermosetting resin can be employed.

For connecting material 16, a conductive connecting material can be employed. For a conductive connecting material, ACP (Anisotropic Conductive Paste) including conductive particles for achieving favorable electrical connection with thermosetting resin set forth above, eutectic solder, or a conductive adhesive may be employed. In the case where a conductive connecting material is employed for connecting material 16, connecting material 16 is preferably applied restrictively to the surface of the wire on insulative base material 11 of connecting sheet 10.

Referring to the schematic sectional view of FIG. 6(b), a back electrode type solar cell 8 is formed on connecting sheet 10.

Referring to the schematic sectional view of FIG. 6(c), back electrode type solar cell 8 is arranged on connecting sheet 10 such that electrode 6 for first conductivity type of back electrode type solar cell 8 is arranged on wire 12 for first conductivity type of connecting sheet 10, and electrode 7 for second conductivity type of back electrode type solar cell 8 is arranged on wire 13 for second conductivity type of connecting sheet 10. At this stage, connecting material 16 located between electrode 6 for first conductivity type of back electrode type solar cell 8 and wire 12 for first conductivity type of connecting sheet 10, as well as connecting material 16 located between electrode 7 for second conductivity type of back electrode type solar cell 8 and wire 13 for second conductivity type of connecting sheet 10, is pushed outwards. Accordingly, electrode 6 for first conductivity type and wire 12 for first conductivity type form contact, ensuring electrical connection. Also, electrode 7 for second conductivity type and wire 13 for second conductivity type of connecting sheet 10 form contact, ensuring electrical connection.

Referring to the schematic sectional view of FIG. 6(d), ultraviolet curable resin 20 is then applied to at least a portion of the peripheral region of back electrode type solar cell 8 under the state in which back electrode type solar cell 8 is placed on connecting sheet 10. Ultraviolet curable resin 20 can be applied by, for example, screen printing, dispenser application, ink jet application, or the like. For ultraviolet curable resin 20, any resin can be employed as long as it cures by irradiation with ultraviolet ray (light having a wavelength of approximately 1 nm-400 nm). For example, the conventional well-known ultraviolet curable resin can be employed.

FIG. 7 is a schematic plan view illustrating an example of the application sites of ultraviolet curable resin in the present invention. Ultraviolet curable resin 20 is applied to respective sites at a portion of the four corners of back electrode type solar cell 8. The four corners correspond to the short sides of an octagon in plan view of back electrode type solar cell 8.

By applying ultraviolet curable resin 20 to the corners of back electrode type solar cell 8 as set forth above, the distance between back electrode type solar cells 8 adjacent in the vertical direction and horizontal direction on connecting sheet 10 can be reduced, as compared to the case where ultraviolet curable resin 20 is applied to a region not at a corner of back electrode type solar cell 8 (in the present example, the long sides of the octagon).

Since back electrode type solar cells 8 can be arranged more densely in this case, the area of the light receiving face per unit area of a solar cell with a connecting sheet and a solar cell module can be increased. Therefore, the properties of the solar cell with a connecting sheet and the solar cell module can be improved.

The above description is based on the case where ultraviolet curable resin 20 is applied at a site at a portion of each of the four corners of back electrode type solar cell 8. Alternatively, ultraviolet curable resin 20 may be applied to one entire corner among the four corners of back electrode type solar cell 8.

The above description is based on the case where ultraviolet curable resin 20 is applied to all the four corners of back electrode type solar cell 8. Alternatively, ultraviolet curable resin 20 may be applied to at least one of the four corners of back electrode type solar cell 8.

The above description is based on the case where the four corners of back electrode type solar cell 8 correspond to the short sides of an octagon. Alternatively, at least one of the four corners may be round such as an arc.

Then, ultraviolet curable resin 20 is irradiated with ultraviolet ray for curing, whereby connecting sheet 10 is bonded to back electrode type solar cell 8 for temporary fixing.

By sandwiching and heating the solar cell with a connecting sheet produced as set forth above between transparent substrate 17 such as a glass substrate including sealing material 18 such as ethylene vinyl acetate and back film 19 such as polyester film including sealing material 18, a solar cell module is produced by sealing back electrode type solar cell 8 constituting the solar cell with a connecting sheet within sealing material 18.

In the case where connecting material 16 located between back electrode type solar cell 8 and connecting sheet 10 constituting the solar cell with a connecting sheet is formed of thermosetting resin, connecting material 16 cures by being heated, whereby back electrode type solar cell 8 and connecting sheet 10 are bonded.

Thus, ultraviolet curable resin 20 is applied to at least a portion of the periphery region of back electrode type solar cell 8, irradiated with ultraviolet ray for curing to temporarily fix back electrode type solar cell 8 with connecting sheet 10, followed by sealing with sealing material 18. Therefore, even when solar cell with a connecting sheet is heated in the sealing step, position deviation in back electrode type solar cell 8 relative to connecting sheet 10, caused by thermal expansion of semiconductor substrate 1 of back electrode type solar cell 8 and/or flowability of sealing material 18, can be suppressed.

Thus, even in the case where the inter-electrode pitch between adjacent electrode 6 for first conductivity type and electrode 7 for second conductivity type in back electrode type solar cell 8 is extremely small, the efficiency of fabricating a solar cell with a connecting sheet and a solar cell module can be improved significantly since the position accuracy of back electrode type solar cell 8 relative to connecting sheet 10 can be maintained at a considerably high level.

Since the curing site and curing level of ultraviolet curable resin 20 can be adjusted appropriately by controlling the site and amount of ultraviolet irradiation, the quality of the solar cell module can be stabilized by adjusting individually the temporary fixing state of back electrode type solar cell 8. The usage of ultraviolet curable resin 20 that is rendered transparent subsequent to curing is preferable from the standpoint of not disturbing the appearance of the solar cell module.

An adhesive tape or the like may be used instead of ultraviolet curable resin 20. Since an adhesive tape is not modified in shape in the arranging mode, the peripheral region of back electrode type solar cell 8 corresponding to temporary fixing can be determined with high accuracy, allowing the region not used for temporary fixing to be employed as the power generating region. Thus, the power generating efficiency of back electrode type solar cell 8 can be further improved.

The connecting material for temporarily fixing back electrode type solar cell 8 with connecting sheet 10 is not limited to ultraviolet curable resin 20 or the adhesive tape set forth above. All materials allowing connection between back electrode type solar cell 8 and connecting sheet 10 are encompassed.

The arrangement of the adhesive for temporary fixing between back electrode type solar cell 8 and connecting sheet 10 is not limited to the manner of arrangement by application, adherence, or the like under the state where back electrode type solar cell 8 is placed on connecting sheet 10. The manner of arranging in advance the connecting material to connecting sheet 10 and/or back electrode type solar cell 8 by attaching or the like is included. For example, in the case where the adhesive is arranged such that a portion thereof covers a portion of the light receiving face of back electrode type solar cell 8, as shown in FIG. 6(d), an adhesive can be arranged with back electrode type solar cell 8 placed on connecting sheet 10. Furthermore, in the case where the adhesive is to be less visible from the light receiving face of the solar cell module, or in the case where the adhesive should not protrude from the light receiving face of back electrode type solar cell 8, back electrode type solar cell 8 is to be placed on connecting sheet 10 after an adhesive is applied in advance to connecting sheet 10 and/or back electrode type solar cell 8.

By curing only connecting material 16 located at at least a portion of the peripheral region of back electrode type solar cell 8, at least a portion of the peripheral region of back electrode type solar cell 8 may be attached to connecting sheet 10 for temporary fixing. This is effective in reducing the fabrication cost of a solar cell module since the usage of ultraviolet curable resin 20, adhesive tape, or the like is not required.

Whatever measures are taken, temporary fixing to connecting sheet 10 is to be achieved to maintain the state of back electrode type solar cell 8 arranged in registration on connecting sheet 10 until a subsequent sealing step, such that electrode 6 for first conductivity type of back electrode type solar cell 8 is electrically connected to wire 12 for first conductive type of connecting sheet 10, and electrode 7 for second conductivity type of back electrode type solar cell 8 is electrically connected to wire 13 for second conductivity type of connecting sheet 10.

The concept of the back electrode type solar cell of the present invention is not limited to a configuration in which both the electrode for first conductivity type and the electrode for second conductivity type are formed on only one surface side (back surface) of the semiconductor substrate set forth above, and encompasses all configurations of the so-called back contact type solar cell (a solar cell based on a configuration in which current is output from the back surface that is opposite to the light receiving face of the solar cell) such as a MWT (Metal Wrap Through) cell (a solar cell based on a configuration in which a portion of the electrode is arranged in a through hole provided at the semiconductor substrate)

The concept of the solar cell with a connecting sheet of the present invention is not limited to a configuration in which a plurality of back electrode type solar cells are arranged on a connecting sheet, and encompasses the configuration in which one back electrode type solar cell is arranged on a connecting sheet.

EXAMPLES

Example

First, thermosetting resin was applied onto the surface of a connecting sheet including an insulative substrate having wire patterned after a predetermined form.

Then, a back electrode type solar cell having a surface of an octagon shape was placed on a connecting sheet such that the electrodes of the back electrode type solar cell were arranged on the wire of the connecting sheet.

Ultraviolet curable resin was applied to each of the short sides of the octagon corresponding to the corners of the peripheral region of the back electrode type solar cell under the state where the back electrode type solar cell was placed on the connecting sheet.

The ultraviolet curable resin was irradiated with ultraviolet ray to cure, whereby the connecting sheet was bonded to the back electrode type solar cell for temporary fixing.

Then, the solar cell with a connecting sheet produced as set forth above was sandwiched between a glass substrate including ethylene vinyl acetate and a polyester film including ethylene vinyl acetate, and subjected to heating. By the sealing treatment step of sealing a back electrode type solar cell constituting a solar cell with a connecting sheet within a sealing material, a solar cell module was produced.

The relative position of the back electrode type solar cell to the connecting sheet was measured, prior to and after the sealing treatment step. The difference between the relative position prior to the sealing treatment step and the relative position after the sealing treatment step was calculated as the amount of position deviation. The results are shown in Table 1.

The position deviation average value in Table 1 represents the average of the amount of position deviation at 8 sites per one back electrode type solar cell. The position deviation maximum value in Table 1 represents the maximum value of the position deviation at 8 sites per one back electrode type solar cell.

Comparative Example

A comparative example was achieved in a manner similar to that of the example set forth above, provided that application and curing of the aforementioned ultraviolet curable resin were not carried out. The position deviation average value and position deviation maximum value were similarly calculated. The results are shown in Table 1.

TABLE 1

|  | Position Deviation Average Value | Position Deviation Maximum Value |
| --- | --- | --- |
| Inventive Example | 30 µm | 55 µm |
| Comparative Example | 50 µm | 145 µm |

As shown in Table 1, the position deviation average value was 30 µm in the example of the present invention whereas the position deviation average value in the comparative example was 50 µm.

Furthermore, as shown in Table 1, the position deviation maximum value was 55 µm in the example of the present invention whereas the position deviation maximum value in the comparative example was 145 µm.

It was confirmed that, in the example where temporary fixing by means of ultraviolet curable resin was carried out, the amount of position deviation was reduced by 20 µm in average and by 90 µm at most, as compared to the comparative example where temporary fixing by means of ultraviolet curable resin was not carried out.

It should be understood that the embodiments and examples disclosed herein are illustrative and non-restrictive in every respect. The scope of the present invention is defined by the terms of the claims, rather than the description above, and is intended to include any modification within the scope and meaning equivalent to the terms of the claims.

INDUSTRIAL APPLICABILITY

The present invention is suitable for a solar cell with a connecting sheet, a solar cell module, and a method of fabricating a solar cell with a connecting sheet.

REFERENCE SIGNS LIST

1 semiconductor substrate; 1a slice damage; 2 impurity diffusion region for first conductivity type; 3 impurity diffusion region for second conductivity type; 4 passivation film; 4a, 4b contact hole; 5 antireflection film; 6 electrode for first conductivity type; 7 electrode for second conductivity type; 8, 80 back electrode type solar cell; 10, 100 connecting sheet; 11 insulative base material; 12, 12a wire for first conductivity type; 13, 13a wire for second conductivity type; 14 connecting wire; 16 connecting material; 17 transparent substrate; 18 sealing material, 19 back film; 20 ultraviolet curable resin; 41 conductor layer; 42 resist pattern; 43 arrow; 60 collector electrode for first conductivity type; 70 collector electrode for second conductivity type.

The invention claimed is:

1. A method of fabricating a solar cell with a connecting sheet including a back electrode type solar cell including a semiconductor substrate where an impurity diffusion region for a first conductivity type and an impurity diffusion region for a second conductivity type are formed, an electrode for the first conductivity type formed at one face side of said semiconductor substrate corresponding to said impurity diffusion region for the first conductivity type, and an electrode for the second conductivity type formed at said one face side of said semiconductor substrate corresponding to said impurity diffusion region for the second conductivity type, and
   a connecting sheet having an insulative base material, a wire for the first conductivity type arranged at said insulative base material, and a wire for the second conductivity type arranged at said insulative base material, said method comprising:
applying a first adhesive to said back electrode type solar cell and/or said connecting sheet,
arranging said back electrode type solar cell on said connecting sheet to sandwich said first adhesive therebetween such that said electrode for the first conductivity type of said back electrode type solar cell is arranged on said wire for the first conductivity type of said connecting sheet, and said electrode for the second conductivity type of said back electrode type solar cell is arranged on said wire for the second conductivity type of said connecting sheet, and
fixing at least a portion of a peripheral region of said back electrode type solar cell to said connecting sheet.

2. The method of fabricating a solar cell with a connecting sheet according to claim 1, wherein said fixing step includes the step of curing a second adhesive located at at least a portion of the peripheral region of said back electrode type solar cell.

3. The method of fabricating a solar cell with a connecting sheet according to claim 1, wherein said fixing step includes the step of curing a second adhesive including ultraviolet curable resin arranged between at least a portion of the peripheral region of said back electrode type solar cell and said connecting sheet.

4. The method of fabricating a solar cell with a connecting sheet according to claim 1, wherein said back electrode type solar cell takes substantially an octagon shape having four corners corresponding to short sides or arcs, and the peripheral region of said back electrode type solar cell includes said four corners.

5. A method of fabricating a solar cell module, comprising: sealing a solar cell with a connecting sheet produced by the method of fabricating a solar cell with a connecting sheet defined in claim 1, on a transparent substrate by a sealing material.

6. The method of fabricating a solar cell module according to claim 5, wherein said step of sealing includes a step of fixing said back electrode type solar cell to said connecting sheet by curing said first adhesive.

7. The method of fabricating a solar cell with a connecting sheet according to claim 2, wherein said second adhesive is applied by dispenser application.

8. The method of fabricating a solar cell with a connecting sheet according to claim 2, wherein said second adhesive is applied to one entire corner among four corners of said back electrode type solar cell.

* * * * *